(12) United States Patent
Wang (10) Patent No.: US 12,317,688 B2
(45) Date of Patent: May 27, 2025

(54) DISPLAY PANEL AND DISPLAY DEVICE WITH NANOCRYSTALLINE PARTICLES THAT IMPROVE THE LIGHT INTENSITIES OF THE LIGHT-EMITTING AREAS

(71) Applicants: WUHAN CHINA STAR OPTOELECTRONICS TECHNOLOGY CO., LTD., Hubei (CN); WUHAN CHINA STAR OPTOELECTRONICS SEMICONDUCTOR DISPLAY TECHNOLOGY CO., LTD., Hubei (CN)

(72) Inventor: Fang Wang, Hubei (CN)

(73) Assignees: WUHAN CHINA STAR OPTOELECTRONICS TECHNOLOGY CO., LTD., Hubei (CN); WUHAN CHINA STAR OPTOELECTRONICS SEMICONDUCTOR DISPLAY TECHNOLOGY CO., LTD., Hubei (CN)

(*) Notice: Subject to any disclaimer, the term of this patent is extended or adjusted under 35 U.S.C. 154(b) by 570 days.

(21) Appl. No.: 17/419,348

(22) PCT Filed: May 19, 2021

(86) PCT No.: PCT/CN2021/094652
§ 371 (c)(1),
(2) Date: Jun. 29, 2021

(87) PCT Pub. No.: WO2022/236858
PCT Pub. Date: Nov. 17, 2022

(65) Prior Publication Data
US 2022/0367579 A1 Nov. 17, 2022

(30) Foreign Application Priority Data
May 8, 2021 (CN) .......................... 202110497670.9

(51) Int. Cl.
*H10K 59/122* (2023.01)
*H10K 59/35* (2023.01)

(52) U.S. Cl.
CPC ......... *H10K 59/122* (2023.02); *H10K 59/353* (2023.02)

(58) Field of Classification Search
CPC ............... H10K 59/122; H10K 59/353; H10K 2102/331; H10K 59/10; H10K 59/12; H01L 2251/5369; H01L 27/3246; H01L 27/3218
See application file for complete search history.

(56) References Cited

U.S. PATENT DOCUMENTS

2004/0017162 A1* 1/2004 Sato .................... H10K 59/8792
315/169.3
2011/0285269 A1* 11/2011 Adachi .............. H10K 50/8428
313/113

(Continued)

FOREIGN PATENT DOCUMENTS

CN 107527942 A 12/2017
CN 107611274 A 1/2018

(Continued)

OTHER PUBLICATIONS

KR20150047697 text (Year: 2015).*

(Continued)

*Primary Examiner* — William B Partridge
*Assistant Examiner* — David Paul Sedorook
(74) *Attorney, Agent, or Firm* — Rivka Friedman (57) ABSTRACT

A display panel and a display device are provided. The display panel includes an array substrate, a pixel defining (Continued)

layer, and a light-emitting functional layer including a first light-emitting part, a second light-emitting part, and a third light-emitting part, wherein the first light-emitting part has a lower quantum efficiency. Pixel defining structures include a first pixel defining structure with a light-enhancing material, and the light-enhancing material is configured to emit light of a same color as light emitted by the first light-emitting part under excitation of light emitted by the first light-emitting part.

16 Claims, 2 Drawing Sheets

(56) References Cited

U.S. PATENT DOCUMENTS

| | | | | |
|---|---|---|---|---|
| 2014/0191357 | A1* | 7/2014 | Lee | H01L 27/14634 257/443 |
| 2016/0126499 | A1* | 5/2016 | Dai | H10K 50/15 257/40 |
| 2020/0168677 | A1* | 5/2020 | Gao | H10K 71/00 |

FOREIGN PATENT DOCUMENTS

| | | | | |
|---|---|---|---|---|
| CN | 108232019 | A | | 6/2018 |
| CN | 108346681 | A | | 7/2018 |
| CN | 108878667 | A | | 11/2018 |
| CN | 109192753 | A | | 1/2019 |
| CN | 109742112 | A | | 5/2019 |
| CN | 109860243 | A | | 6/2019 |
| CN | 110400888 | A | | 11/2019 |
| CN | 110429188 | A | | 11/2019 |
| CN | 111416052 | A | | 7/2020 |
| CN | 111584549 | A | * 8/2020 | ......... H01L 27/3232 |
| KR | 20150047697 | A | * 5/2015 | .......... H10K 50/856 |
| KR | 20200117293 | A | | 10/2020 |

OTHER PUBLICATIONS

CN111584549 text (Year: 2020).*
International Search Report in International application No. PCT/CN2021/094652, mailed on Jan. 26, 2022.
Written Opinion of the International Search Authority in International application No. PCT/CN2021/094652, mailed on Jan. 26, 2022.
Chinese Office Action issued in corresponding Chinese Patent Application No. 202110497670.9 dated Feb. 28, 2022, pp. 1-6.

* cited by examiner

DISPLAY PANEL AND DISPLAY DEVICE WITH NANOCRYSTALLINE PARTICLES THAT IMPROVE THE LIGHT INTENSITIES OF THE LIGHT-EMITTING AREAS

FIELD OF INVENTION

This application relates to a field of display technology, in particular to a display panel and a display device.

BACKGROUND OF INVENTION

Organic light-emitting diodes (OLEDs) have been favored by market in recent years because they can be fabricated on flexible substrates.

Regarding small and medium-sized panels, with arrival of folding mobile phones, development of OLED displays has entered a second explosive stage. However, in a most commonly used red (R), green (G), and blue (B) three primary color pixel side-by-side pixelation system for mobile phone panels, a phosphorescent system used in light-emitting parts of a red sub-pixel and a green sub-pixel has a theoretical internal quantum efficiency of 100%, while a light-emitting part of a blue sub-pixel still adopts a traditional blue fluorescent structure. Because fluorescent material of the blue fluorescent structure can only use 25% of singlet excitons, a theoretical internal quantum efficiency of the fluorescent material can only reach 25%. Because only 25% of singlet excitons can be used, low luminous efficiency and high power consumption of the blue fluorescent structure have always been bottlenecks hindering the development of OLED displays.

Technical Problem

Embodiments of the present invention provide a display panel and a display device, which can solve problems of low luminous efficiency and high power consumption of current display panels.

SUMMARY OF INVENTION

An embodiment of the present application provides a display panel, the display panel includes: an array substrate; a pixel defining layer disposed on one side of the array substrate, wherein the pixel defining layer includes a plurality of pixel defining structures; and a light-emitting functional layer including a plurality of light-emitting parts disposed in the pixel defining structures, wherein the plurality of light-emitting parts comprise a first light-emitting part, a second light-emitting part, and a third light-emitting part, and a quantum efficiency of light emitting of the first light-emitting part is less than a quantum efficiency of light emitting of the second light-emitting part and less than a quantum efficiency of light emitting of the third light-emitting part. Wherein, the pixel defining structures includes a first pixel defining structure, the first light-emitting part is disposed in the first pixel defining structure, the first pixel defining structure includes a light-enhancing material, and the light-enhancing material can emit light of the same color as light emitted by the first light-emitting part under excitation of light emitted by the first light-emitting part.

Optionally, the light-enhancing material includes nanocrystalline particles.

Optionally, the first pixel defining structure includes: a first light-enhancing part disposed adjacent to the first light-emitting part; and a first light-transmitting part disposed on one side of the first light-enhancing part away from the first light-emitting part; wherein, the first light-enhancing part includes the light-enhancing material.

Optionally, both the first light-enhancing part and the first light-transmitting part include a transparent base material, wherein the light-enhancing material is doped in the transparent base material of the first light-enhancing part.

Optionally, the first light-enhancing part further includes a microstructure.

Optionally, the plurality of pixel defining structures further include a second pixel defining structure and a third pixel defining structure respectively disposed corresponding to the second light-emitting part and the third light-emitting part. The second pixel defining structure includes a second light-enhancing part disposed adjacent to the second light-emitting part, and the third pixel defining structure includes a third light-enhancing part disposed adjacent to the third light-emitting part, both of the second light-enhancing part and the third light-enhancing part are provided with the light-enhancing material. Wherein, particle sizes of the light-enhancing material in both the second light-enhancing part and the third light-enhancing part are greater than a particle size of the light-enhancing material in the first light-enhancing part.

Optionally, the light-emitting colors of the first light-emitting part, the second light-emitting part, and the third light-emitting part are blue, green, and red, respectively.

Optionally, the particle sizes of the light-enhancing material in the first light-enhancing part, in the second light-enhancing part, and in the third light-enhancing part, are sequentially increased.

Optionally, a range of particle size of the light-enhancing material in the third light-enhancing part is greater than a range of particle size of the light-enhancing material in the first light-enhancing part and a range of particle size of the light-enhancing material in the second light-enhancing part.

Optionally, the ranges of particle size of the light-enhancing material in the first light-enhancing part, in the second light-enhancing part, and in the third light-enhancing part are defined as a, b, and c, respectively, wherein a=(0,2], b=(2, 3], and c=[5, 8].

An embodiment of the present application further provides a display device, which includes a display panel, and the display panel includes: an array substrate; a pixel defining layer disposed on one side of the array substrate, wherein the pixel defining layer includes a plurality of pixel defining structures; and a light-emitting functional layer including a plurality of light-emitting parts disposed in the pixel defining structures, wherein the plurality of light-emitting parts include a first light-emitting part, a second light-emitting part, and a third light-emitting part, and a quantum efficiency of light emitting of the first light-emitting part is less than a quantum efficiency of light emitting of the second light-emitting part and less than a quantum efficiency of light emitting of the third light-emitting part. Wherein, the plurality of pixel defining structures include a first pixel defining structure, the first light-emitting part is disposed in the first pixel defining structure, the first pixel defining structure includes a light-enhancing material, and the light-enhancing material is configured to emit light with the same color as light emitted by the first light-emitting part under excitation of light emitted by the first light-emitting part.

Optionally, the light-enhancing material includes nanocrystalline particles.

Optionally, the first pixel defining structure includes a first light-enhancing part disposed adjacent to the first light-emitting part and a first light-transmitting part disposed on one side of the first light-enhancing part away from the first light-emitting part, wherein, the first light-enhancing part includes the light-enhancing material.

Optionally, both the first light-enhancing part and the first light-transmitting part include a transparent base material, wherein the light-enhancing material is doped in the transparent base material of the first light-enhancing part.

Optionally, the first light-enhancing part further includes a microstructure.

Optionally, the pixel defining structures further include a second pixel defining structure and a third pixel defining structure respectively disposed corresponding to the second light-emitting part and the third light-emitting part. The second pixel defining structure includes a second light-enhancing part disposed adjacent to the second light-emitting part, and the third pixel defining structure includes a third light-enhancing part disposed adjacent to the third light-emitting part, both of the second light-enhancing part and the third light-enhancing part are provided with the light-enhancing material. Wherein, particle sizes of the light-enhancing material in both the second light-enhancing part and the third light-enhancing part are greater than a particle size of the light-enhancing material in the first light-enhancing part.

Optionally, the light-emitting colors of the first light-emitting part, the second light-emitting part, and the third light-emitting part are blue, green, and red, respectively.

Optionally, the particle sizes of the light-enhancing material in the first light-enhancing part, in the second light-enhancing part, and in the third light-enhancing part, are sequentially increased.

Optionally, a range of particle size of the light-enhancing material in the third light-enhancing part is greater than a range of particle size of the light-enhancing material in the first light-enhancing part and a range of particle size of the light-enhancing material in the second light-enhancing part.

Optionally, the ranges of particle size of the light-enhancing material in the first light-enhancing part, in the second light-enhancing part, and in the third light-enhancing part are defined as a, b, and c, respectively, wherein a=(0, 2], b=(2, 3], and c=[5, 8].

In the display panel provided by the present application, a light-enhancing material is disposed in the pixel defining structure corresponding to at least part of the light-emitting part, and the light-enhancing material can emit light with the same color as light emitted by the first light-emitting part under excitation of light emitted by the first light-emitting part. Therefore, the absorption of light by at least part of the pixel defining layer can be reduced, the light extraction efficiency of the display panel can be improved, and the power consumption of the display panel can be reduced.

DESCRIPTION OF DRAWINGS

In order to more clearly describe the technical solutions in the embodiments of the present application, the following will briefly introduce the drawings that need to be used in the description of the embodiments. Obviously, the drawings in the description are only some embodiments of the application. For those skilled in the art, other drawings can be obtained based on these drawings without creative work.

DETAILED DESCRIPTION OF PREFERRED EMBODIMENTS

The following will clearly and completely describe the technical solutions in the embodiments of the present application with reference to the drawings in the embodiments of the present application. Obviously, the embodiments are only a part of the embodiments of the present application, rather than all the embodiments. Based on these embodiments in the present application, all other embodiments obtained by those skilled in the art without creative work shall fall within the protection scope of this application. In addition, it should be understood that the specific implementations described here are only used to illustrate and explain the present application, and are not used to limit the present application. In this application, if no explanation is made to the contrary, the orientation terms such as "upper" and "lower" generally refer to the upper and lower directions of the device in actual use or working state, specifically refer to the directions in the drawings, and "inner" and "outer" refer to the outline of the device.

The following disclosure provides various embodiments or examples to realize different structures of the present application. In order to simplify the disclosure of the present application, the components and arrangements of specific examples are described below. Certainly, they are only examples and are not intended to limit the application. Furthermore, this application may repeat reference numbers and/or reference letters in different examples. This repetition is for the purpose of simplification and clarity, and it does not indicate the relationship between the various embodiments and/or arrangements discussed. In addition, this application provides examples of various specific processes and materials, but those of ordinary skill in the art may be aware of the application of other processes and/or the use of other materials. Detailed descriptions are provided below, and it should be noted that the order of description in the embodiments is not intended to limit the preferred order of the embodiments.

The display panel generally includes sub-pixels of various colors, such as red sub-pixels, green sub-pixels, and blue sub-pixels, etc. In current display panels, the light-emitting parts of different color sub-pixels may have differences in quantum efficiency based on differences in light-emitting systems, materials, or structures. That is, the photoelectric conversion capability of some light-emitting parts is relatively strong, and the photoelectric conversion capability of some light-emitting parts is relatively weak, which may further cause problems of low light extraction efficiency and high power consumption of the display panel.

In response to the above-mentioned problems, the present application provides a display panel in which a light-enhancing material is provided in a pixel defining structure corresponding to at least a part of the light-emitting part, and the light-enhancing material can emit light of the same color as light emitted by the light-emitting part under excitation of light emitted by the light-emitting part. Therefore, the absorption of light by at least part of the pixel defining layer can be reduced, the light extraction efficiency of the display panel can be improved, and the power consumption of the display panel can be reduced.

First Embodiment

Figure 1:
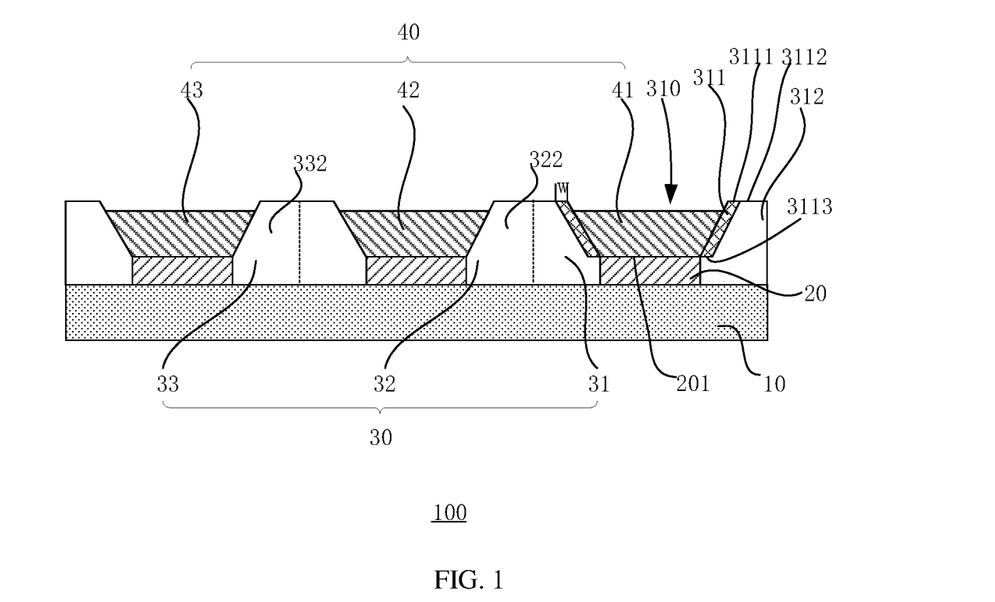
FIG. 1 is a schematic diagram of a display panel described in a first embodiment of the present application.

Please refer to FIG. 1. In this embodiment, the display panel 100 includes an array substrate 10 and a plurality of sub-pixels arranged on the array substrate 10, such as a plurality of first sub-pixels, a plurality of second sub-pixels, and a plurality of third sub-pixels. Each first sub-pixel, each second sub-pixel, and each third sub-pixel is respectively provided with a first light-emitting part 41, a second light-emitting part 42, and a third light-emitting part 43 that emits light of different wavelength bands.

In this embodiment, the array substrate 10 includes, for example, a base substrate and a thin film transistor (TFT) layer disposed on the base substrate. Certainly, the array substrate 10 may also include a planarization layer, a passivation layer, and other film layers, which are not limited herein.

The base substrate can be a rigid substrate or a flexible substrate. For example, it is made of glass materials, metal materials, or plastic materials including polyethylene terephthalate (PET), polyethylene naphthalate (PEN), or polyimide (PI).

Before forming the TFT, a layer structure such as a buffer layer may be formed on the base substrate. The buffer layer may be formed on the entire surface of the base substrate, or may be formed by being patterned. The buffer layer may include suitable materials such as polyethylene terephthalate (PET), polyethylene naphthalate (PEN), polyacrylate, and/or polyimide, which is a layered structure formed in the form of a single layer or a multilayer stack. The buffer layer may also be formed of silicon oxide or silicon nitride, or may be a composite layer including an organic material and/or an inorganic material.

The thin film transistor in the thin film transistor layer may include a semiconductor layer, a gate electrode, a source electrode, and a drain electrode. The semiconductor layer may be formed of an amorphous silicon layer, a metal oxide, or a polysilicon layer, or may be formed of an organic semiconductor material. In one embodiment, the semiconductor layer includes a channel region and a source region and a drain region doped with dopants.

Because the thin film transistors have complicated layer structures, it is necessary to form a planarization layer on the thin film transistors to form a sufficiently flat top surface. After the planarization layer is formed, an electrode via (not shown) may be formed in the planarization layer to expose the drain electrode of the TFT.

In this embodiment, each sub-pixel may include an anode, a cathode, a light-emitting part disposed between the anode and the cathode, and a pixel defining structure surrounding the light-emitting part. The sub-pixel may be at least one of a blue sub-pixel, a green sub-pixel, or a red sub-pixel. In this embodiment, the first sub-pixel is a blue sub-pixel, the second sub-pixel is a green sub-pixel, and the third sub-pixel is a red sub-pixel. That is, the light emission colors of the first light-emitting part 41, the second light-emitting part 42, and the third light-emitting part 43 are blue, green, and red, respectively.

The anode in the sub-pixel is formed by, for example, the first electrode layer 20 provided on the array substrate 10. The first electrode layer 20 is electrically connected to the drain electrode of the TFT through the electrode via in the planarization layer.

The array substrate 10 is further provided with, for example, a pixel defining layer 30. The pixel defining layer 30 is specifically disposed on the first electrode layer 20 and includes a plurality of pixel defining structures. The plurality of pixel defining structures includes a first pixel defining structure 31, a second pixel defining structure 32, and a third pixel defining structure 33. The pixel defining structure is formed of a single material layer or a composite material layer of suitable organic materials such as polyacrylate and polyimide. In this embodiment, the pixel defining structure may include a transparent base material formed of polyimide, and the light transmittance of the transparent base material is greater than 0 and less than 100%.

The array substrate 10 is further provided with, for example, a light-emitting functional layer 40, and the light-emitting functional layer 40 is specifically disposed on the pixel defining layer 30. The light-emitting functional layer 40 includes a plurality of light-emitting parts correspondingly disposed in the plurality of pixel defining structures. The light-emitting parts include a first light-emitting part 41, a second light-emitting part 42, and a third light-emitting part 43, wherein the first light-emitting part 41 is correspondingly disposed in an opening 310 of the first pixel defining structure 31, the second light-emitting part 42 is correspondingly disposed in the second pixel defining structure 32, and the third light-emitting part 43 is correspondingly disposed in the third pixel defining structure 33.

Wherein, the quantum efficiency of the first light-emitting part 41 is lower than the quantum efficiency of the second light-emitting part 42 and the quantum efficiency of the third light-emitting part 43. The quantum efficiency of the second light-emitting part 42 and the quantum efficiency of the third light-emitting part 43 may be the same or different. The first pixel defining structure 31 includes a light-enhancing material. The light-enhancing material is not provided in the second pixel defining structure 32 and the third pixel defining structure 33. Under the excitation of light emitted by the first light-emitting part 41, the light-enhancing material can emit light of the same color as light emitted by the first light-emitting part 41, thereby, the absorption of light emitted by the first light-emitting part 41 by the first pixel defining structure 31 is reduced, the light output from the first sub-pixel is increased, and the light extraction efficiency of the display panel 100 is improved. It should be noted that in other embodiments of this application, when the quantum efficiencies of the first light-emitting part and the second light-emitting part are lower than the quantum efficiency of the third light-emitting part, the light-enhancing part containing the light-enhancing material may also be provided only in the first pixel defining structure and the second pixel defining structure, or when the quantum efficiencies of the first light-emitting part and the third light-emitting part are lower than the quantum efficiency of the second light-emitting part, the light-enhancing part containing the light-enhancing material may also be provided only in the first pixel defining structure and the third pixel defining structure.

Further, the light-enhancing material includes nanocrystalline particles. The nanocrystalline particles match the wavelength band of light emitted by the first light-emitting part 41 in the first sub-pixel. For example, plasmon resonance is generated between the physical size of the nanocrystalline particles and the wavelength band of the above-mentioned light, and the physical size of the corresponding different nano particles varies with the wavelength band of light emitted by different light-emitting parts. Therefore, under excitation of light emitted by the first light-emitting part 41, light having the same color as the light emitted by the first light-emitting part 41 can be emitted, and thus the absorption of light emitted by the first light-emitting part 41 by the transparent base material of the first pixel defining structure 31 is reduced, the light output from the first sub-pixel is increased, and the light extraction efficiency of the display panel 100 is improved. Specifically, the light emission color of the first light-emitting part 41 is blue. Because blue light has a certain wavelength range, correspondingly, the range of particle size of the nanocrystalline particles in the first pixel defining structure 31 is defined as a, and a=(0,2]. That is, the nanocrystalline particles in the first light-emitting part 41 have a variety of particle sizes to correspond to respective wavelength ranges of the blue light of the first light-emitting part 41, so as to improve the light extraction efficiency while ensuring the color accuracy of the display panel 100. Certainly, this application does not limit the specific material of the light-enhancing material. Other materials capable of emitting light of the same color as light emitted by the light-emitting part under excitation of light emitted by the light-emitting part belong to the protection scope of this application.

Further, the first pixel defining structure 31 includes: a first light-enhancing part 311 disposed adjacent to the first light-emitting part 41 and forming side walls of the opening 310, wherein the thickness (w) of the first light-enhancing part 311 is greater than 0 μm and less than or equal to 0.5 μm; and a first light-transmitting part 312 located on a side of the first light-enhancing part 311 away from the first light-emitting part 41. An end surface 3111 of the first light-enhancing part 311 which is away from the array substrate 10 is flushed with an end surface 3112 of the first light-transmitting part 312 which is away from the array substrate 10. An end surface 3113 of the first light-enhancing part 311 which is adjacent to the array substrate 10 and a top surface 201 of the first electrode layer 20 are at a same plane, and the end surface 3113 is not in contact with the first electrode layer 20. Wherein, the first light-enhancing part 311 includes the light-enhancing material. Specifically, for example, the light-enhancing material is not provided in the first light-transmitting part 312, so as to prevent interference light from being generated when external ambient light irradiates a region of the first light-transmitting part 312 of the first pixel defining structure 31, thereby affecting display effect of the display panel 100. Because the second pixel defining structure 32 and the third pixel defining structure 33 are not provided with light-enhancing materials, the second pixel defining structure 32 includes a second light-transmitting part 322 disposed adjacent to the second light-emitting part 42 and the third pixel defining structure 33 includes a third light-transmitting part 332 disposed adjacent to the third light-emitting part 43.

Further, the first light-enhancing part 311 and the first light-transmitting part 312 both include a transparent base material, and the transparent base material is, for example, a polyimide material. The light-enhancing material is doped in the first light-enhancing part 311 in the transparent base material. The second light-transmitting part 322 of the second pixel defining structure 32 and the third light-transmitting part 332 of the third pixel defining structure 33 both include the transparent base material, and the transparent base materials located in different regions in the pixel defining layer and the light-enhancing material in the transparent base material are integrally formed. In this application, the light-enhancing material is doped in the transparent base material of the first light-enhancing part 311, so that the first light-enhancing part 311 and the first light-transmitting part 312 form an integrated structure, which improves the stability of the light-enhancing material, and ensures the bonding quality of the first light-enhancing part 311 and the first light-emitting part 41 to prevent peeling of the film. Certainly, this application does not limit the combination manner of the first light-enhancing part 311 and the first light-transmitting part 312. In other embodiments, the first light-enhancing part 311 is, for example, an independent film layer formed of the light-enhancing material. The independent film layer is coated on the sidewall of the first light-transmitting part 312 close to the first light-emitting part 41 formed by a transparent base material by inkjet printing. The specific process can be: After forming the entire surface of the light-enhancing material coating with a thickness (w) greater than 0 and less than 0.5 μm on the transparent base material, a photolithography process is used to etch away the light-enhancing material coating in areas other than the sidewall of the first light-transmitting part 312 of the first light-emitting part 41, so as to prevent the generation of interference light and the work function between the anode and the light-emitting part from being affected.

Figure 2:
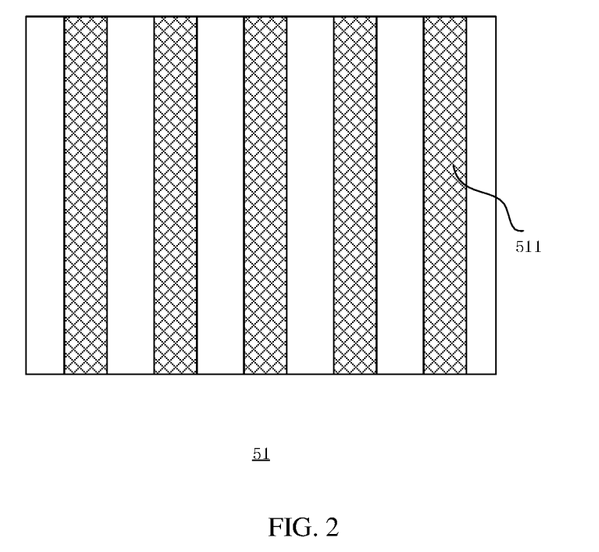
FIG. 2 is a schematic plan view of a microstructure described in the first embodiment of the present application.
Figure 3:
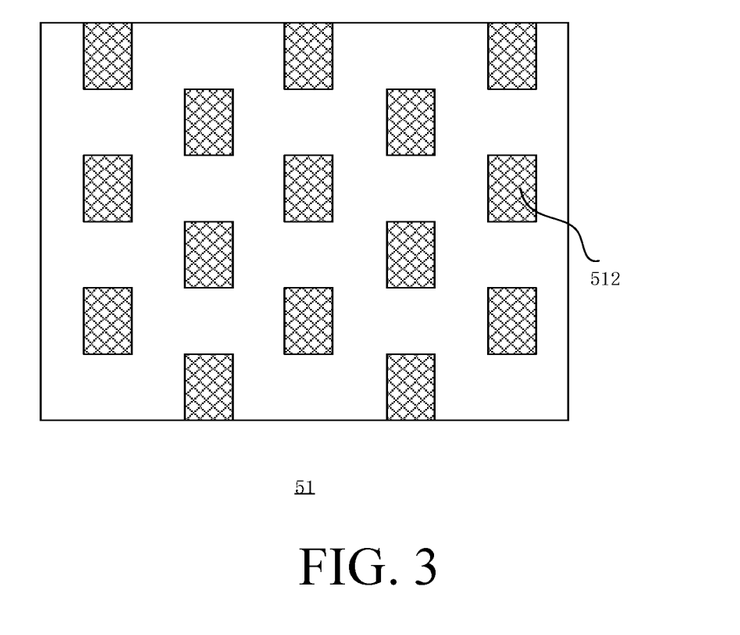
FIG. 3 is a schematic plan view of another microstructure described in the first embodiment of the present application.

Further, referring to FIG. 2 and FIG. 3. The first light-enhancing part 311 includes a microstructure 51. By forming the first light-enhancing part 311 into a patterned microstructure 51, an enhancing effect of the first light-enhancing part 311 on the light extraction efficiency of the first sub-pixel can be effectively controlled. Therefore, the light output from the first sub-pixel is limited to a limited extent, so the display effect of each sub-pixel of the display panel 100 is improved and balanced. Specifically, the microstructure 51 is, for example, a plurality of light-enhancing strips 511 arranged at intervals, and each light-enhancing strip 511 is filled with the transparent base material, or the microstructure 51 is a plurality of island-shaped light-enhancing units 512 arranged at intervals, and the transparent base material is filled between adjacent light-enhancing units 512.

The cathode in the sub-pixel is formed by, for example, a second electrode layer (not shown) provided on the array substrate 10. The second electrode layer is disposed on the light-emitting functional layer 40, and the second electrode layer is formed by, for example, a vapor deposition process, and covers the first light-emitting part 41, the second light-emitting part 42, and the third light-emitting part 43, correspondingly.

For example, an encapsulation structure (not shown) is also formed on the second electrode layer. It can be easily understood that because the functional film layers of the sub-pixel, especially the light-emitting functional layer 40, is an organic light-emitting material, it is very sensitive to external environments such as water vapor and oxygen. If the light-emitting functional layer 40 in the display panel 100 is exposed to an environment with water vapor or oxygen, the performance of the display panel 100 will drop sharply or even be completely damaged. The encapsulation structure can block air and water vapor for the sub-pixels, thereby ensuring the reliability of the display panel 100. It is understandable that the encapsulation structure can be a one-layer or multi-layer structure, can be an organic film layer or an inorganic film layer, or a stacked structure of an organic film layer and an inorganic film layer. For example, in some embodiments, the encapsulation layer may include two inorganic film layers and an organic film layer between the two inorganic film layers.

In another aspect, an embodiment of the present application further provides a display device, including the above-mentioned display panel 100.

Second Embodiment

Figure 4:
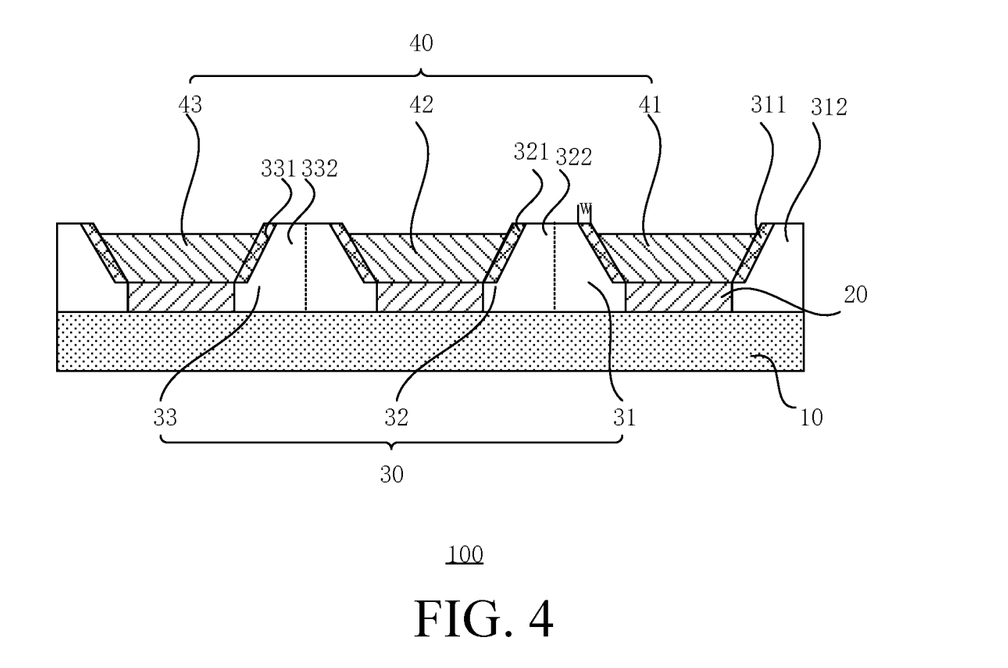
FIG. 4 is a schematic diagram of a display panel described in a second embodiment of the present application.

Please refer to FIG. 4. In this embodiment, the display panel 100 includes an array substrate 10 and a plurality of sub-pixels arranged on the array substrate 10, such as a plurality of first sub-pixels, a plurality of second sub-pixels, and a plurality of third sub-pixels. Each first sub-pixel, each second sub-pixel, and each third sub-pixel are respectively provided with a first light-emitting part 41, a second light-emitting part 42, and a third light-emitting part 43 that emit light of different wavelength bands.

The specific film structure of the display panel 100 is similar to that of the first embodiment. For the same parts, this embodiment will not repeat them here. The difference is as follows: The second pixel defining structure 32 includes a second light-enhancing part 321 arranged adjacent to the second light-emitting part 42 and a second light-transmitting part 322 located on a side of the second light-enhancing part 321 away from the second light-emitting part 42. The third pixel defining structure 33 includes a third light-enhancing part 331 arranged adjacent to the third light-emitting part 43 and a third light-transmitting part 332 located on a side of the third light-enhancing part 331 away from the third light-emitting part 43, wherein, the second light-enhancing part 321 and the third light light-enhancing 331 are both provided with the light-enhancing material, and the second light-transmitting part 322 and the third light-transmitting part 332 are not provided with the light-enhancing material. The particle sizes of the light-enhancing materials in the second light-enhancing part 321 and the third light-enhancing part 331 are greater than the particle size of the light-enhancing material in the first light-enhancing part 311. The light-enhancing material is, for example, nanocrystalline ions. By providing the light-enhancing part in each pixel defining structure of the display panel 100, the light extraction efficiency of the display panel can be improved as a whole, and the display effect can be improved.

Further, the first pixel defining structure 31, the second pixel defining structure 32, and the third pixel defining structure 33 all include a transparent base material. The transparent base material corresponding to the first light-enhancing part 311, the second light-enhancing part 321, and the third light-enhancing part 331 are all doped with the light-enhancing material. In this application, the light-enhancing material is disposed in the transparent base material of the first light-enhancing part 311, the second light-enhancing part 321, and the third light-enhancing part 331 by doping, so that the first light-enhancing part 311, the first light-transmitting part 312, the second light-enhancing part 321, the second light-transmitting part 322, the third light-enhancing part 331, and the third light-transmitting part 332 form an integrated structure, which improves the stability of the light-enhancing material, and ensures the bonding quality of the light-enhancing part and the light-emitting part. Certainly, this application does not limit the combination manner of the light-enhancing part and the light-transmitting part. In other embodiments, the light-enhancing part is, for example, an independent film layer formed of the light-enhancing material. The independent film layer is coated on the sidewall of the light-transmitting part close to the light-emitting part formed by a transparent base material by inkjet printing. The specific process can be: After forming the entire surface of the light-enhancing material coating with a thickness (w) greater than 0 and less than 0.5 μm on the transparent base material, a photolithography process is used to etch away the light-enhancing material coating in an areas other than the sidewall of the first light-transmitting part 312, the second light-transmitting part 322, and the third light-transmitting part 332 to prevent the generation of interference light and the work function between the anode and the light-emitting part from being affected.

Further, the second light-enhancing part 321 and the third light-enhancing part 331 both include microstructure, and the first light-enhancing part 311 may not include the microstructure. Because the microstructure can adjust the enhancement effect of the light-enhancing part on the light extraction efficiency of the sub-pixels, the microstructure in this embodiment may specifically reduce the effect of enhancing the light extraction efficiency of the sub-pixels by the light-enhancing part, so that the light extraction efficiency of each sub-pixel can be balanced, and the display effect of the display panel 100 can be ensured. Certainly, the above object can also be achieved by making the thickness of the second light-enhancing part 321 and the thickness of the third light-enhancing part 331 thinner than the thickness of the first light-enhancing part 311. The specific details will not be repeated in this embodiment.

Further, the light-enhancing material in the first light-enhancing part 311 has the smallest particle size, the light-enhancing material in the second light-enhancing part 321 has the second smallest particle size, and the light-enhancing material in the third light-enhancing part 331 has the largest particle size.

Further, a range of particle size of the light-enhancing material in the third light-enhancing part 331 is greater than a range of particle size of the light-enhancing material in the first light-enhancing part 311 and a range of particle size of the light-enhancing material in the second light-enhancing part 321. The light emission colors of the first light-emitting part 41, the second light-emitting part 42, and the third light-emitting part 43 are blue, green, and red, respectively. In this application, the range of particle size of the light-enhancing material in the third light-enhancing part 331 corresponding to the third light-emitting part 43 with a red emission color is set to be maximum. This enables the red light of the fixed wavelength band emitted by the third light-emitting part 43 to excite a wider wavelength range of red light after being absorbed by the third light-enhancing part 331, so as to achieve the effect of enhancing the international commission on illumination (CIE) of the red sub-pixel. Specifically, the range of particle sizes of the light-enhancing material in the first light-enhancing part 311, the second light-enhancing part 321, and the third light-enhancing part 331 are defined as a, b, and c, respectively, wherein a=(0,2], b=(2,3], and c=[5,8].

In another aspect, an embodiment of the present application further provides a display device, including the above-mentioned display panel 100.

The detailed introduction to a display panel provided by an embodiment of the present application is described above, and specific examples are used in this article to illustrate the principle and implementation of the present application. The description of the above embodiment is only used to help understand the method and core idea of this application. Those of ordinary skill in the art should understand that they can still modify the technical solutions described in the foregoing embodiments, or equivalently replace some of the technical features. However, these modifications or replacements do not cause the essence of the corresponding technical solutions to deviate from the scope of the technical solutions of the embodiments of the present application.

What is claimed is:

1. A display panel, comprising:
   an array substrate;
   a first electrode layer disposed on a side of the array substrate;
   a pixel defining layer disposed on one side of the first electrode layer away from the array substrate, wherein the pixel defining layer comprises a plurality of pixel defining structures; and a light-emitting functional layer comprising a plurality of light-emitting parts disposed in the pixel defining structures, wherein the plurality of light-emitting parts comprise a first light-emitting part, a second light-emitting part, and a third light-emitting part, and a quantum efficiency of light emitting of the first light-emitting part is less than a quantum efficiency of light emitting of the second light-emitting part and less than a quantum efficiency of light emitting of the third light-emitting part; and wherein the plurality of pixel defining structures comprise a first pixel defining structure, the first light-emitting part is disposed in an opening of the first pixel defining structure, the first pixel defining structure comprises a light-enhancing material comprising nanocrystalline particles;

wherein the first pixel defining structure comprises:
a first light-enhancing part disposed adjacent to the first light-emitting part and forming side walls of the opening; a top surface of the first electrode layer, and an end surface of the first light-enhancing part adjacent to the array substrate are at a same plane, and the end surface is not in contact with the first electrode layer; and a first light-transmitting part disposed on one side of the first light-enhancing part away from the first light-emitting part; wherein the first light-enhancing part comprises the light-enhancing material, wherein the first light-enhancing part and the first light-transmitting part both comprise a transparent base material, and the light-enhancing material is doped in the transparent base material of the first light-enhancing part;

wherein a thickness of the first light-enhancing part is greater than 0 μm and less than or equal to 0.5 μm; and a range of a particle size of the light-enhancing material in the first light-enhancing part is defined as a, wherein a=(0, 2];

such that under excitation of light emitted by the first light-emitting part, the nanocrystalline particles are configured to match a wavelength band of the light to emit other light with a same color as the first light-emitting part.

2. The display panel according to claim 1, wherein the pixel defining structures further comprise a second pixel defining structure and a third pixel defining structure respectively disposed corresponding to the second light-emitting part and the third light-emitting part, the second pixel defining structure comprises a second light-enhancing part disposed adjacent to the second light-emitting part, the third pixel defining structure comprises a third light-enhancing part disposed adjacent to the third light-emitting part, and both the second light-enhancing part and the third light-enhancing part are provided with the light-enhancing material; and
wherein particle sizes of the light-enhancing material in both the second light-enhancing part and the third light-enhancing part are greater than the particle size of the light-enhancing material in the first light-enhancing part.

3. The display panel according to claim 2, wherein light emission colors of the first light-emitting part, the second light-emitting part, and the third light-emitting part are blue, green, and red, respectively.

4. The display panel according to claim 3, wherein the particle sizes of the light-enhancing material in the first light-enhancing part, in the second light-enhancing part, and in the third light-enhancing part are sequentially increased.

5. The display panel according to claim 4, wherein a range of the particle size of the light-enhancing material in the third light-enhancing part is greater than the range of the particle size of the light-enhancing material in the first light-enhancing part and a range of the particle size of the light-enhancing material in the second light-enhancing part.

6. The display panel according to claim 5, wherein the ranges of the particle size of the light-enhancing material in the second light-enhancing part, and in the third light-enhancing part are defined as b, and c, respectively, wherein b=(2, 3], and c=[5, 8].

7. A display device, comprising a display panel, wherein the display panel comprises:
an array substrate;
a first electrode layer disposed on a side of the array substrate;
a pixel defining layer disposed on one side of the first electrode layer away from the array substrate, wherein the pixel defining layer comprises a plurality of pixel defining structures; and
a light-emitting functional layer comprising a plurality of light-emitting parts disposed in the pixel defining structures, wherein the plurality of light-emitting parts comprise a first light-emitting part, a second light-emitting part, and a third light-emitting part, and a quantum efficiency of light emitting of the first light-emitting part is less than a quantum efficiency of light emitting of the second light-emitting part and less than a quantum efficiency of light emitting of the third light-emitting part; and
wherein the plurality of pixel defining structures comprise a first pixel defining structure, the first light-emitting part is disposed in an opening of the first pixel defining structure, the first pixel defining structure comprises a light-enhancing material comprising nanocrystalline particles;
wherein the first pixel defining structure comprises:
a first light-enhancing part disposed adjacent to the first light-emitting part and forming side walls of the opening; a top surface of the first electrode layer, and an end surface of the first light-enhancing part adjacent to the array substrate are at a same plane, and the end surface is not in contact with the first electrode layer; and
a first light-transmitting part disposed on one side of the first light-enhancing part away from the first light-emitting part; wherein the first light-enhancing part comprises the light-enhancing material;
wherein the first light-enhancing part and the first light-transmitting part both comprise a transparent base material, and the light-enhancing material is doped in the transparent base material of the first light-enhancing part;
wherein a thickness of the first light-enhancing part is greater than 0 μm and less than or equal to 0.5 μm; and a range of a particle size of the light-enhancing material in the first light-enhancing part is defined as a, wherein a=(0, 2];
such that under excitation of light emitted by the first light-emitting part, the nanocrystalline particles are configured to match a wavelength band of the light to emit other light with a same color as the first light-emitting part.

8. The display device according to claim 7, wherein the pixel defining structures further comprise a second pixel defining structure and a third pixel defining structure respectively disposed corresponding to the second light-emitting part and the third light-emitting part, the second pixel defining structure comprises a second light-enhancing part disposed adjacent to the second light-emitting part, the third pixel defining structure comprises a third light-enhancing part disposed adjacent to the third light-emitting part, and both the second light-enhancing part and the third light-enhancing part are provided with the light-enhancing material; and wherein particle sizes of the light-enhancing material in both the second light-enhancing part and the third light-enhancing part are greater than the particle size of the light-enhancing material in the first light-enhancing part.

9. The display device according to claim 8, wherein light emission colors of the first light-emitting part, the second light-emitting part, and the third light-emitting part are blue, green, and red, respectively.

10. The display device according to claim 9, wherein the particle sizes of the light-enhancing material in the first light-enhancing part, in the second light-enhancing part, and in the third light-enhancing part are sequentially increased.

11. The display device according to claim 10, wherein a range of the particle size of the light-enhancing material in the third light-enhancing part is greater than the range of the particle size of the light-enhancing material in the first light-enhancing part and a range of the particle size of the light-enhancing material in the second light-enhancing part.

12. The display device according to claim 11, wherein the ranges of the particle size of the light-enhancing material in the second light-enhancing part, and in the third light-enhancing part are defined as b, and c, respectively, wherein b=(2, 3], and c=[5, 8].

13. The display panel according to claim 1, wherein the first light-enhancing part further comprises a microstructure.

14. The display panel according to claim 13, wherein the microstructure is patterned, and the microstructure is a plurality of light-enhancing strips arranged at intervals or a plurality of island-shaped light-enhancing units arranged at intervals, the transparent base material is filled between adjacent two of the plurality of light-enhancing strips or adjacent two of the plurality of island-shaped light-enhancing units.

15. The display device according to claim 7, wherein the first light-enhancing part further comprises a microstructure.

16. The display device according to claim 15, wherein the microstructure is patterned, and the microstructure is a plurality of light-enhancing strips arranged at intervals or a plurality of island-shaped light-enhancing units arranged at intervals, the transparent base material is filled between adjacent two of the plurality of light-enhancing strips or adjacent two of the plurality of island-shaped light-enhancing units.

* * * * *